United States Patent

Hong et al.

[11] Patent Number: 5,882,972
[45] Date of Patent: Mar. 16, 1999

[54] METHOD OF FABRICATING A BURIED BIT LINE

[75] Inventors: Gary Hong, Hsin-Chu; Yau-Kae Sheu, Hsinchu; Wenchi Ting, Taipei, all of Taiwan

[73] Assignee: United Semiconductor Corp., Taipei, Taiwan

[21] Appl. No.: 114,005

[22] Filed: Jul. 10, 1998

[30] Foreign Application Priority Data

Jun. 4, 1998 [TW] Taiwan ................................. 87108821

[51] Int. Cl.$^6$ ................................................ H01L 21/8236
[52] U.S. Cl. ........................ 438/276; 438/282; 438/289; 438/524
[58] Field of Search ................................. 438/259, 275, 438/276, 277, 278, 282, 289, 514, 524, 530, 922, 923, 589, 660

[56] References Cited

U.S. PATENT DOCUMENTS

| | | | |
|---|---|---|---|
| 4,200,968 | 5/1980 | Schroeder | 438/282 |
| 4,604,150 | 8/1986 | Lin | 438/923 |
| 5,180,680 | 1/1993 | Yang | 438/259 |
| 5,460,987 | 10/1995 | Wen et al. | 438/589 |
| 5,504,025 | 4/1996 | Fong-Chun et al. | 438/278 |
| 5,529,954 | 6/1996 | Iijima et al. | 438/660 |
| 5,602,049 | 2/1997 | Wen et al. | 438/276 |
| 5,668,031 | 9/1997 | Hsue et al. | 438/275 |

*Primary Examiner*—Charles Bowers
*Assistant Examiner*—Jack Chen
*Attorney, Agent, or Firm*—Thomas, Kayden, Horstemeyer & Risley, L.L.P.

[57] ABSTRACT

A method of fabricating a buried bit line. An insulating layer is formed on a substrate, a trench is formed within the substrate by patterning the insulating layer and the substrate and then a liner oxide is formed on the trench surface. Then, a first conductive layer is formed on the insulating layer to cover the liner oxide layer and fills the trench. A portion of the first conductive layer is removed, exposing a portion of the liner oxide layer. Next, the exposed liner oxide layer is removed to form a space which, along with the trench, is filled with a second conductive layer on the insulating layer. Ion implantation and annealing is performed to form a shallow junction region in the substrate and the shallow junction region makes contact with the second conductive layer. A portion of the second conductive layer is then removed and the remaining second conductive layer fills the trench wherein the remaining second conductive layer is electrically coupled with the first conductive layer and the shallow junction region.

12 Claims, 3 Drawing Sheets

५,८८२,९७२

METHOD OF FABRICATING A BURIED BIT LINE

CROSS-REFERENCE TO RELATED APPLICATION

This application claims the priority benefit of Taiwan application serial no. 87108821, filed Jun. 4, 1998, the full disclosure of which is incorporated herein by reference.

BACKGROUND OF THE INVENTION

1. Field of the Invention

The invention relates to a method of fabricating an integrated circuit, and more particularly to a method of fabricating a buried bit line, which reduces the space between bit lines, reduces the resistance and also increases the integration of integrated circuits.

2. Description of the Related Art

Memory is widely applied in the integrated circuit industry and plays an especially essential role in the electronic industry. As the industry develops, the demand for high-density memory increases and correlative industries research and develop high density memory to satisfy the demand. Therefore, how to keep the lower resistance of the quality as device dimension is scaled down is now a major problem for the industry to overcome.

For the storage of digital data, the capacitance of the memory is called a "bit" and the unit for data storage in a memory is called a "memory cell". The memory cell is arranged in an array, consisting of columns and rows. A set of a column and a row represents a specific address. Memory cells in the same column or the same row are coupled by a common wiring line, which is called a word line. The vertical wiring line related to data transmittance is called a bit line. Usually, memory is located on chiastic plan of wiring lines that are parallel, buried under bit lines and vertically ranked on the substrate. An obvious case of this is Read-Only Memory (ROM).

FIG. 1 is a top view of a portion (four memory cells) of ROM. FIG. 2 is a cross-sectional view of the ROM shown in FIG. 1.

Referring to FIG. 1, a mask ROM is formed on a P-type substrate 10 and includes buried bit lines 12, 14, 16 which are arranged and formed by selectively doping the substrate 10 to form N-type bit lines. The word lines 18, 20 are arranged in parallel on the substrate 10 surface and perpendicular to the bit lines 12, 14, 16. There is a silicon oxide layer separating the word lines 18, 20.

Mask ROM is a kind of structure having participative bit lines. Bit lines 12, 14, 16 are the source/drain regions of a metal oxide semiconductor field effect transistor (MOSFET), word lines 18, 20 are the gates of MOSFET and the channel region 22, 24, 26, 28 of MOSFET are under the word lines 18, 20 and adjacent to the bit lines 12, 14, 16. However, data storage is achieved by varying transmittance of respective transistors. In other words, data stored in the transistors can be changed by adjusting the threshold voltage of a transistor. Therefore, selecting a different array of transistors with distinct threshold voltage can accomplish ROM programming.

FIG. 2 is a cross-sectional view of the conventional ROM at the dashed line 2-2' in FIG. 1. The conventional method of forming a buried bit line is to cover the substrate 10 with a suitable mask (not shown) and then implant N-type ions into the substrate 10 to form bit lines 12, 14, and 16. As semiconductor integration increases, the cross-sectional area also decreases and therefore electrical resistance rises. The way to solve this problem is to increase the concentration and the depth of the buried bit lines in the substrate. However, as the device dimension is scaled down, it is easy to produce punch through and junction breakage under the normal operative voltages, whether or not the concentration or depth of the buried bit lines in the substrate is increased. The substrate 10, with dopant, is then put into an oxidation environment with high temperature in order to activate impurities in the bit lines and thus an oxide layer is formed on the substrate 10. The oxide layer includes a thinner gate oxide layer 30 located on the channel region 22, 24 and a thicker oxide layer 32 over the bit lines 12, 14, 16. The oxide layer is thicker because the diffusion rate of the heavy doping N-type ions in the bit lines is far higher than the diffusion rate of the light doping P-type ions in the channel 22, 24. But as the gate oxide layer 30 is formed by thermal oxidation, impurities in the buried bit lines are diffused outward under these high temperatures. Therefore, the bit lines cannot be allowed to get too close. The drawback of memory devices with buried bit lines is that the device dimension cannot be scaled down indefinitely. After the oxide layer is completed, a layer of polysilicon, with dopant, is formed to cover the oxide layer 32 and is patterned to form a MOSFET gate electrode 18. The gate electrode 18 serves as a word line of ROM.

As the size of ROM shown in FIG. 1 and FIG. 2 is reduced, the width of buried bit lines 12, 14, 16 becomes smaller and the space between the bit lines is also narrower. The smaller the bit line, the higher the resistance. This reduces the reading and writing speed of ROM. Because the space between bit lines becomes narrower, punch through is more easily produced under normal operative voltages and if punch through occurs, the transistor may be out of control and this constrains the dimension of transistors. Furthermore, impurities in the buried bit lines diffuse outwardly as the gate oxide layer is thermally formed. Thus, it is necessary to fabricate a device structure with reduced dimension which does not affect device performance.

SUMMARY OF THE INVENTION

It is therefore an object of the invention to provide a method of fabricating a buried bit line which prevents punch through, caused by device dimension reduction. If this is accomplished, a bit line with a lower resistance can be obtained.

To achieve these objects and advantages, and in accordance with the purpose of the invention, as embodied and broadly described herein, the invention is directed towards a method of fabricating a buried bit line. An insulating layer is formed on a substrate, a trench is formed within the substrate by pattering the insulating layer and the substrate, and a liner oxide layer is formed on the trench surface. Then, a first conductive layer is formed on the insulating layer to cover the liner oxide layer and the trench is filled with the first conductive layer. A portion of the first conductive layer is removed, exposing a portion of the liner oxide layer.

Next, the exposed liner oxide layer is removed to form a space which, along with the trench, is filled with a second conductive layer on the insulation layer. Ion implantation and annealing is then performed to form a shallow junction region in the substrate and the shallow junction region makes contact with the second conductive layer. A portion of the second conductive layer is then removed and the remaining second conductive layer fills the trench wherein the remaining second conductive layer is coupled electrically with the first conductive layer and the shallow junction region.

It is to be understood that both the foregoing general description and the following detailed description are exemplary and explanatory only and are not restrictive of the invention, as claimed.

DESCRIPTION OF THE PREFERRED EMBODIMENTS

Figure 1:
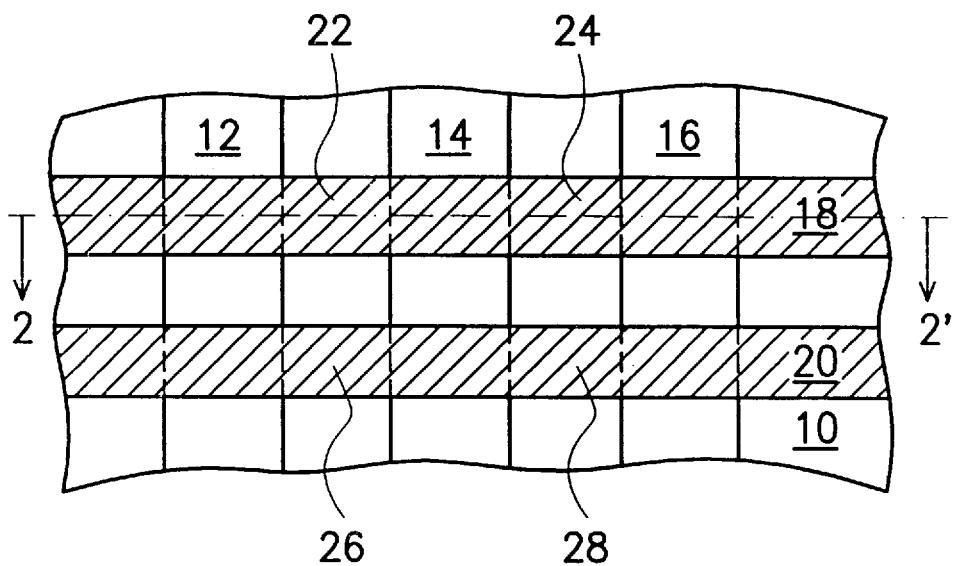
FIG. 1 is a top view of a convention ROM.
Figure 2:
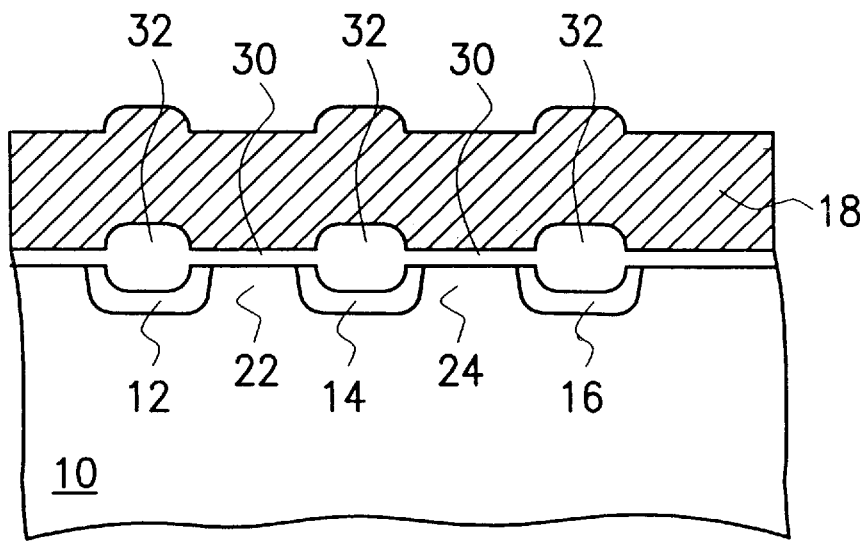
FIG. 2 is a cross-sectional view of the conventional ROM shown in FIG. 1.
Figure 3A:
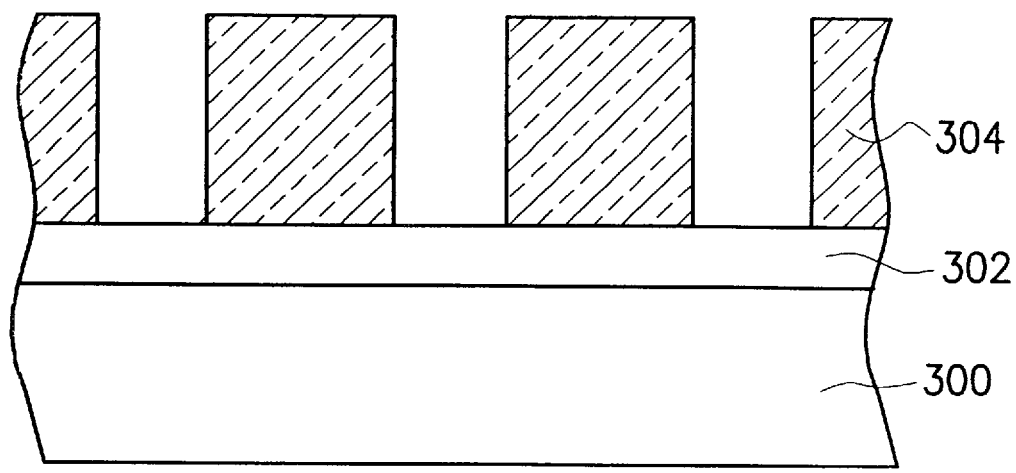
FIGS. 3A–3G show the fabrication flow of a buried bit line in accordance with a preferred embodiment of the invention.

Referring to FIG. 3A, an insulating layer 302 is formed by thermal oxidation on a semiconductor substrate 300, such as a silicon substrate. The insulating layer 302 includes a silicon oxide layer with a thickness of about 2000–5000 Å. A photoresist layer 304 is then formed on the insulating layer 302. The substrate 300 is patterned by photolithography to form a pattern of trenches and to expose a portion of the insulating layer 302 surface.

Figure 3B:
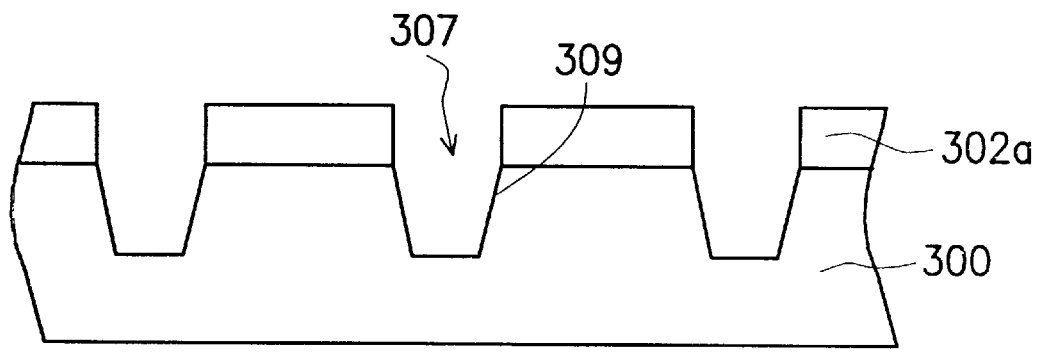

Referring to FIG. 3B, using the photoresist layer 304 as a mask, an etching process is performed on the insulating layer 302 and semiconductor substrate 300. A trench 307 with sloping sidewalls 309 is formed within the semiconductor substrate 300 and the sloping sidewalls 309 improve the quality of gap-filling. A portion of semiconductor substrate 300 is exposed and the insulating layer 302a covers the surface of the semiconductor substrate 300. Then, the photoresist layer 304 is removed.

Figure 3C:
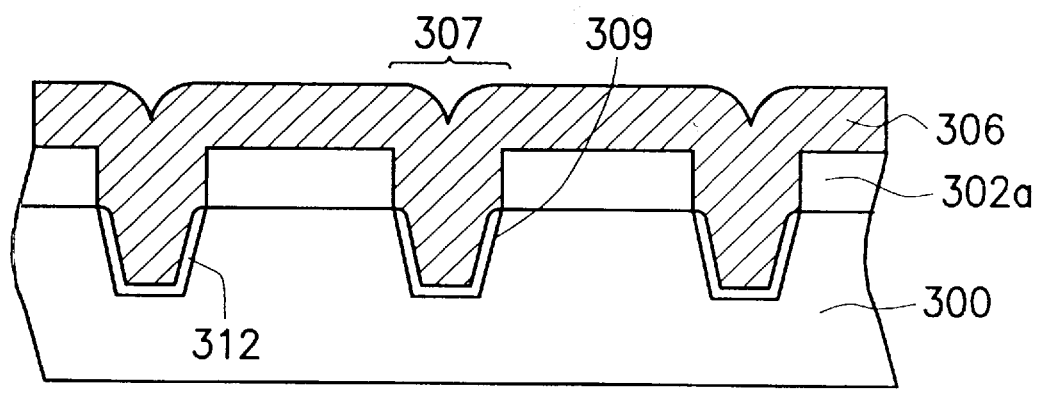

Referring to FIG. 3C, a liner oxide layer 312 is formed by, for example, thermal oxidation, with a thickness of about 300–500 Å on the trench 309 surface. Thereafter, a conductive layer 306 with low resistance is formed on the insulating layer 302a. The trench 307 is filled with the conductive layer 306, which includes polysilicon, polysilicon/tungsten silicide, titanium nitride/tungsten and titanium nitride/copper.

Figure 3D:
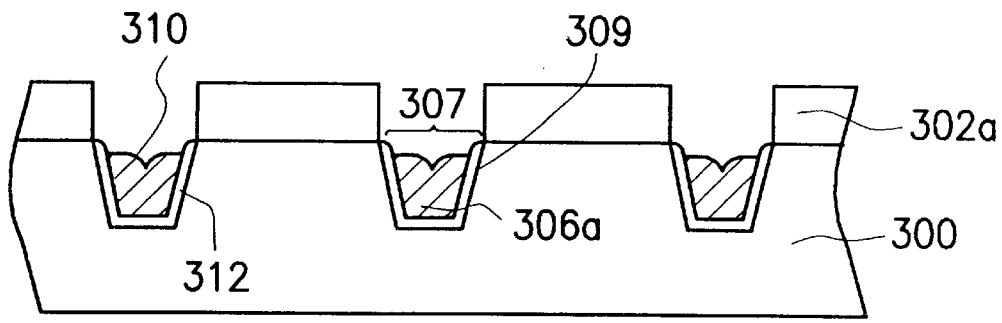

Referring to FIG. 3D, a portion of conductive layer 306 is removed by etching back until the conductive layer 306a surface is about 0.05 µm–0.15 µm lower than the substrate surface. A portion of liner oxide layer 312 is still exposed.

Figure 3E:
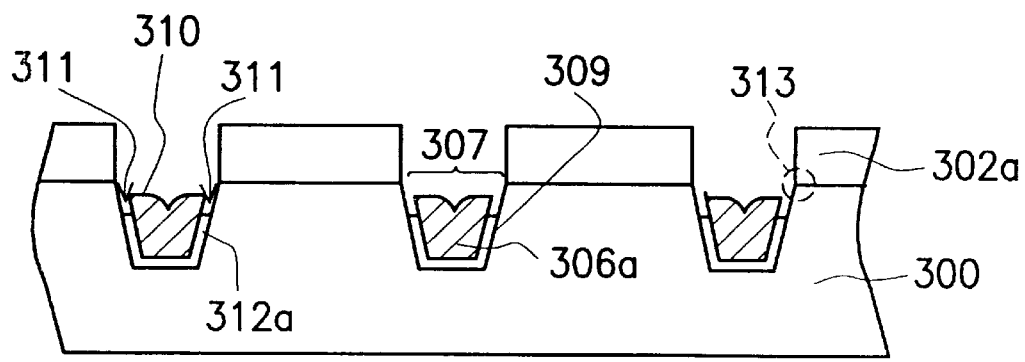

Referring to FIG. 3E, a portion of the liner oxide layer 312 is higher than the conductive layer 306a. Surface 310 and the exposed liner oxide layer 312 are removed by wet etching by, for example, dipping it in a HF solution. Therefore, a top corner 313 of the semiconductor substrate 300 is exposed and the liner oxide layer 312a is formed and conformed to the trench 307 surface. Next, an etching space 311 is formed between the semiconductor substrate 300 and the conductive layer 306a on the liner oxide layer 312a.

Figure 3F:
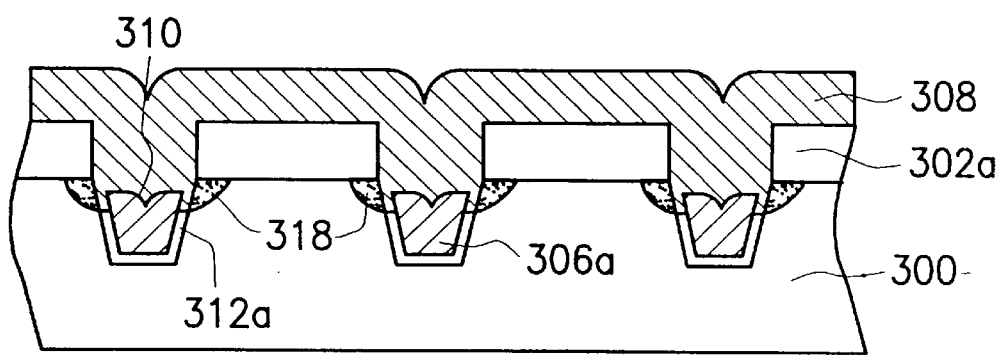

Referring to FIG. 3F, a conductive layer 308, such as polysilicon, is formed on the insulating layer 302a and at least fills the etching space 311 and the trench 307. The conductive layer 308 makes contact with the conductive layer 306a surface 310 and also coupled electrically with a portion of semiconductor substrate 300. Afterward, ion implantation and annealing is performed and ions, including arsenic (As), with a dosage of about $1 \times 10^{15} - 1 \times 10^{16}$ atoms/cm$^2$. Impurities in the conductive layer 308 introduced by implantation can diffuse through top corner 313 of semiconductor substrate 300 via the annealing process. Then a N$^+$ shallow junction region 318 with the same impurities as the conductive layer 308 can be formed in the semiconductor substrate 300.

Figure 3G:
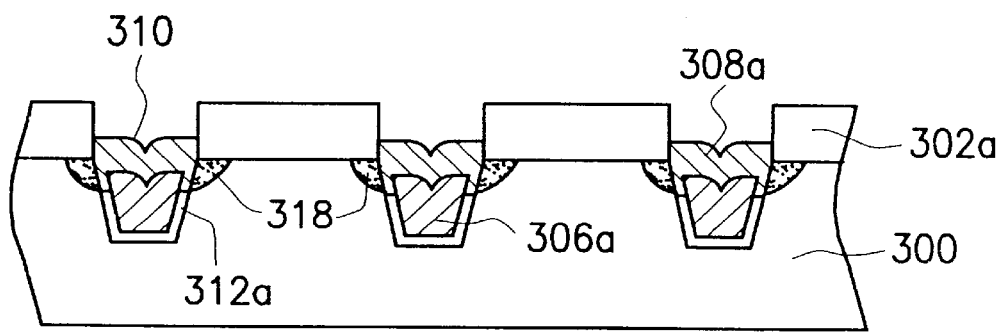

Referring to FIG. 3G, a portion of conductive layer 308 is removed by etching back until the remaining conductive layer 308a fills the trench 307 and the conductive layer 308a is coupled electrically with both the conductive layer 306a and the N$^+$ shallow junction region 318. Accordingly, a conductive buried bit line, including conductive layer 306a and conductive layer 308a, is formed within the trench 307. There is a N$^+$ shallow junction region between the conductive layer 308a and the semiconductor substrate 300. Otherwise, the N$^+$ shallow junction region 318 has the same conductivity as the conductive layer 308a.

In summary, the features of this invention include:

1. The buried line is composed of a conductive layer including polysilicon, polysilicon/tungsten silicide, titanium nitride/tungsten or titanium nitride/copper and a polysilicon layer with dopant. The former can reduce the resistance of a buried bit line and the later can make contact with the substrate to form a N+ shallow junction, which can prevent the punch through which is often produced under normal operative voltages. Therefore, as the integration of integrated circuit increases, the dimensions of device can be reduced.

2. In this invention, the buried bit line is formed with a low resistance conductive material and a N+ shallow junction region is then formed between the buried bit line and the substrate. Because of these, as described above, the problem can be overcome as the impurities in the bit line are diffused outwardly due to the formation of gate oxide layer thermally.

3. The process of this invention is compatible with current processes and therefore it can be easily integrated into the semiconductor fabrication process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a buried bit line, comprising:

providing a substrate and forming a insulating later on the substrate;

forming a trench by patterning the insulating layer and the substrate;

forming a liner oxide layer on the trench surface;

forming a first conductive layer on the insulating layer to cover the liner oxide layer and fill the trench;

removing a portion of the first conductive layer to expose a portion of the liner oxide layer;

removing the exposed liner oxide layer to form a space;

forming a second conductive layer on the insulating layer and filling the space and the trench;

performing a ion implantation and annealing to form a shallow junction region in the substrate and make contact with the second conductive layer; and removing a portion of the second conductive layer and filling the trench with the remaining conductive layer wherein the remaining second conductive layer is coupled electrically with the first conductive layer and the shallow junction region.

2. The method according to claim 1, wherein the insulating layer includes a silicon oxide layer.

3. The method according to claim 1, wherein the thickness of the insulating layer is in a range of about 2000–4000 Å.

4. The method according to claim 1, wherein the thickness of the liner oxide layer is in a range of about 300–500 Å.

5. The method according to claim 1, wherein the first conductive layer includes polysilicon, polysilicon/tungsten silicide, titanium nitride/tungsten and titanium/copper alternatively.

6. The method according to claim 1, wherein removing a portion of the first conductive layer includes an etching back process.

7. The method according to claim 1, wherein removing the exposed liner oxide layer includes wet etching.

8. The method according to claim 1, wherein the second conductive layer includes polysilicon.

9. The method according to claim 1, wherein the impurity in the implantation includes As.

10. The method according to claim 1, wherein the implantation has a dosage is in a range of about $1\times10^{15}$–$1\times10^{16}$ atoms/cm$^2$.

11. The method according to claim 1, wherein the shallow junction region is of a conductive type that is the same as the second conductive layer.

12. The method according to claim 1, wherein removing a portion of the second conductive layer includes an etching back process.

* * * * *